United States Patent
Yang et al.

(10) Patent No.: US 7,242,070 B2
(45) Date of Patent: Jul. 10, 2007

(54) DEEP TRENCH ISOLATION STRUCTURE OF A HIGH-VOLTAGE DEVICE AND METHOD FOR FORMING THEREOF

(75) Inventors: Jia-Wei Yang, Hsinchu (TW); Chih-Cherng Liao, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 91 days.

(21) Appl. No.: 11/246,092

(22) Filed: Oct. 11, 2005

(65) Prior Publication Data

US 2006/0027890 A1    Feb. 9, 2006

Related U.S. Application Data

(63) Continuation of application No. 10/354,130, filed on Jan. 30, 2003, now Pat. No. 6,972,471.

(30) Foreign Application Priority Data

Oct. 25, 2002  (TW) ................. 91125218 A

(51) Int. Cl.
 H01L 29/00  (2006.01)
 H01L 21/76  (2006.01)
(52) U.S. Cl. .................................. 257/506; 438/433
(58) Field of Classification Search ........ 438/370, 438/418, 433, 449; 257/303, 330, 506, 510
See application file for complete search history.

(56) References Cited

U.S. PATENT DOCUMENTS

| | | | |
|---|---|---|---|
| 4,653,177 | A | 3/1987 | Lebowitz et al. |
| 4,833,094 | A | 5/1989 | Kenney |
| 4,939,567 | A | 7/1990 | Kenney |
| 5,066,607 | A | 11/1991 | Banerjee |
| 5,442,214 | A | 8/1995 | Yang |
| 5,684,319 | A | 11/1997 | Hebert |
| 5,843,828 | A | 12/1998 | Kinoshita |
| 5,892,264 | A | 4/1999 | Davis et al. |
| 6,252,277 | B1 | 6/2001 | Chan et al. |
| 6,476,443 | B1 | 11/2002 | Kinzer |
| 6,518,618 | B1 | 2/2003 | Fazio et al. |
| 6,576,516 | B1 | 6/2003 | Blanchard |
| 6,838,735 | B1 | 1/2005 | Kinzer et al. |
| 2001/0026989 | A1 | 10/2001 | Thapar |

*Primary Examiner*—Calvin Lee
(74) *Attorney, Agent, or Firm*—Birch, Stewart, Kolasch & Birch, LLP

(57) ABSTRACT

A deep trench isolation structure of a high-voltage device and a method of forming thereof. An epitaxial layer with a second type conductivity is formed on a semiconductor silicon substrate with a first type conductivity. A deep trench passes through the epitaxial layer. An ion diffusion region with the first type conductivity is formed in the epitaxial layer and surrounds the sidewall and bottom of the deep trench. An undoped polysilicon layer fills the deep trench.

15 Claims, 3 Drawing Sheets

DEEP TRENCH ISOLATION STRUCTURE OF A HIGH-VOLTAGE DEVICE AND METHOD FOR FORMING THEREOF

CROSS-REFERENCE TO RELATED APPLICATION

This application is a Continuation of application Ser. No. 10/354,130, filed on Jan. 30, 2003, now U.S. Pat. No. 6,972,471 the entire contents of which are hereby incorporated by reference.

BACKGROUND

The invention relates to an isolation structure of a semiconductor device and a method of forming thereof, and more particularly to a deep trench isolation structure of a high-voltage device and a method of forming thereof.

Recently, as the manufacturing techniques of semiconductor integrated circuits develop, the request of highly integrating controllers, memories, low-voltage operating circuits and high-voltage power devices on a single chip increases to achieve a single-chip system, in which the power device including vertical double-diffused transistor (VDMOS), lateral double-diffused transistor (LDMOS) and insulated gate bipolar transistor (IGBT), is used to increase power transform efficiency and decrease energy wastage. Since the high-voltage transistor and the low-voltage CMOS circuit device are provided on the single chip, an isolation structure is required to isolate the high-voltage device and the low-voltage device. Also, in order to fit in with a high breakdown voltage that is requested by the high-voltage device, the isolation structure must reach predetermined-depth isolation. Therefore, a deep trench isolation structure formed in a thick epitaxial layer has been developed by extra providing an epitaxial layer on a semiconductor substrate.

FIG. 1 is a cross-section of a conventional isolation structure of a high-voltage device. In a case of a P-type semiconductor silicon substrate 10, a N-type epitaxial layer 12 is provided on the P-type semiconductor silicon substrate 10, and a N-type buried layer (NBL) 14 is embedded between the N-type epitaxial layer 12 and the P-type semiconductor silicon substrate 10. Also, two $P^+$-type deep trench isolation structures 16 are formed in the N-type epitaxial layer 12 to define a high-voltage area, and a plurality of field oxidation (FOX) regions 18 are formed on the upper surface of the N-type epitaxial layer 12 to isolate components within the high-voltage area. Moreover, a P-type body 22 is formed in the N-type epitaxial layer 12 between the second FOX region 18II and the third FOX region 18III, and a pair of $N^+$-type diffusion regions 24 and a pair of $P^+$-type diffusion regions 26 that are respectively electrically connected to exterior wires are formed in the P-type body 22. Furthermore, a gate structure 28 is formed on the surface of the P-type body 22.

In manufacturing the $P^+$-type deep trench isolation structure 16, a deep trench formed in the N-type epitaxial layer 12 is filled with an oxide layer, and then ion implantation is employed to implant $B^+$ ions into the oxide layer by, and finally thermal annealing is employed to diffuse the $B^+$ ions in the oxide layer. For spreading the $B^+$ ions around within the deep trench, however, the procedure time of the thermal annealing is very long, resulting in increased thermal budget. Also, since the thermal annealing makes the $B^+$ ions diffuse both toward a vertical direction and a lateral direction, the width W of the $P^+$-type deep trench isolation structure 16 increases as the depth H of the $P^+$-type deep trench isolation structure 16 increases. When the deep trench 16 is requested to reach predetermined-depth isolation, the lateral size of the $P^+$-type deep trench isolation structure is also increases, resulting in the required size of a chip being increased.

Accordingly, how to forming a deep trench isolation structure with decreasing thermal budget and reducing the lateral size of the deep trench isolation structure to solve the problems caused by the prior method is called for.

SUMMARY

Accordingly, an object of the invention is to provide a deep trench isolation structure of a high-voltage device and a method of forming thereof, in which a $P^+$-type diffusion region and an undoped polysilicon layer within a deep trench are formed as a $P^+$-type deep trench isolation structure.

To achieve these and other advantages, the invention provides a semiconductor device. A semiconductor silicon substrate with a first type conductivity is provided. An epitaxial layer with a second type conductivity different from the first type conductivity is disposed on the semiconductor silicon substrate. A high voltage device is defined by at least two deep trench isolation structures, wherein each the isolation structure comprises a deep trench passing through the epitaxial layer, an ion diffusion region with the first type conductivity formed in the epitaxial layer and surrounding the sidewall and bottom of the deep trench, and an undoped polysilicon layer filling the deep trench, wherein the high voltage device comprises at least one field oxidation region interposed between a transistor and the deep trench isolation structures.

The invention further provides a semiconductor device. A semiconductor silicon substrate with a first type conductivity is provided. An epitaxial layer with a second type conductivity different from the first type conductivity is disposed on the semiconductor silicon substrate. A high voltage device is defined by at least two deep trench isolation structures, wherein each the isolation structure comprises a deep trench passing through the epitaxial layer, an ion diffusion region with the first type conductivity formed in the epitaxial layer and surrounding the sidewall and bottom of the deep trench, and an undoped polysilicon layer filling the deep trench, wherein the high voltage device comprises at least a sinker with the second type conductivity and a transistor. The sinker is coupled to the semiconductor silicon substrate and separated from the deep trench isolation structures by a first field oxidation region, and separated from the transistor by a second field oxidation region.

DESCRIPTION OF THE DRAWINGS

For a better understanding of the present invention, reference is made to a detailed description to be read in conjunction with the accompanying drawings, in which.

DETAILED DESCRIPTION

A preferred embodiment of the present invention is now described with reference to FIGS. 2A through 2G, in which a P-type semiconductor substrate is provided to form a P+-type deep trench isolation structure within a high-voltage device area. In another case, the present invention can apply to the formation of an N+-type deep trench isolation structure.

Figure 1:
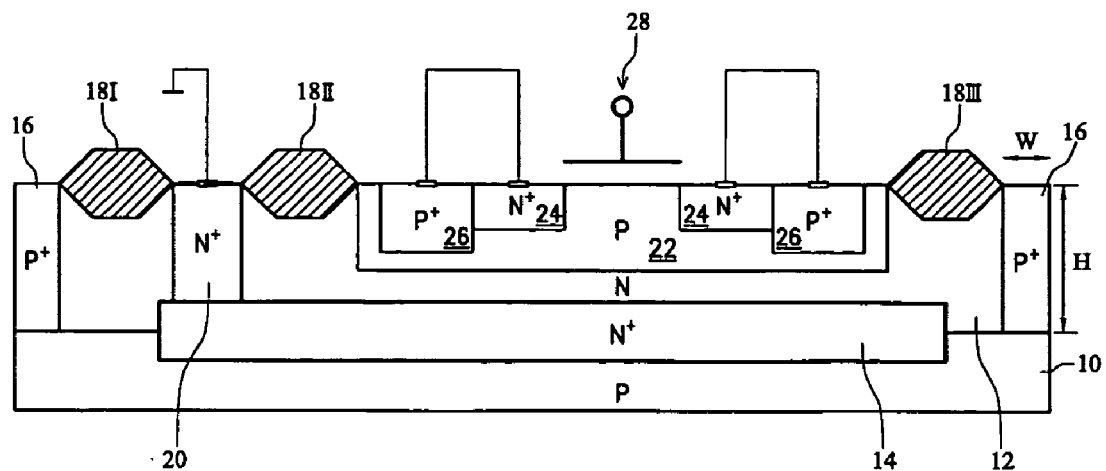
FIG. 1 is a cross-section of a conventional isolation structure of a high-voltage device.
Figure 2A:
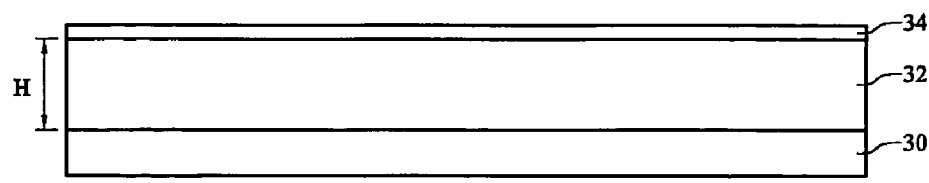
FIGS. 2A to 2G are cross-sections of a method of forming a deep trench isolation structure of a high-voltage device according the present invention.
Figure 2B:
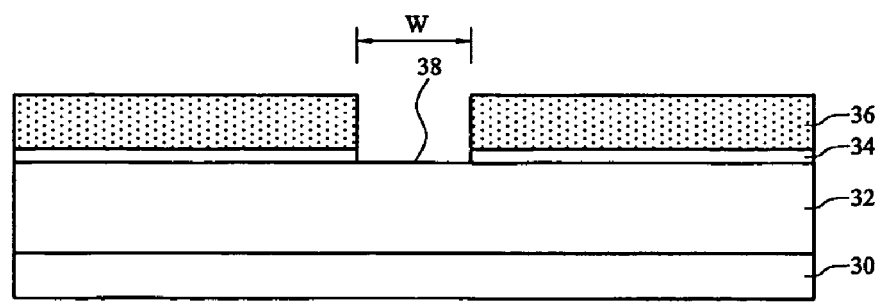

FIGS. 2A to 2G are cross-sections of a method of forming a deep trench isolation structure of a high-voltage device according the present invention. In FIG. 2A, an N-type epitaxial layer 32 is formed on a P-type semiconductor silicon substrate 30, and an oxide layer 34 is formed on the N-type epitaxial layer 32. Preferably, the thickness of the N-type epitaxial layer 32 is approximately equal to the predetermined depth H of the deep trench isolation structure. In addition, for product demands, an N-type buried layer (NBL) may be formed between the N-type epitaxial layer 32 and the P-type semiconductor silicon substrate 30. Then, in FIG. 2B, a photoresist layer 36 having a deep trench pattern is formed on the oxide layer 34 to define the width W of the deep trench isolation structure. Next, using the photoresist layer 36 as a mask, the exposed area of the oxide layer 34 is etched to form an opening 38.

Figure 2C:
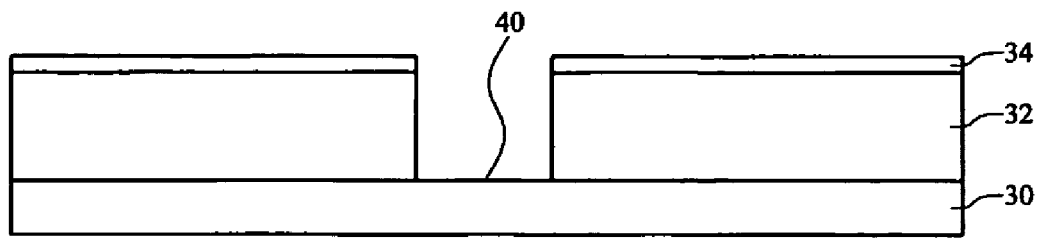
Figure 2D:
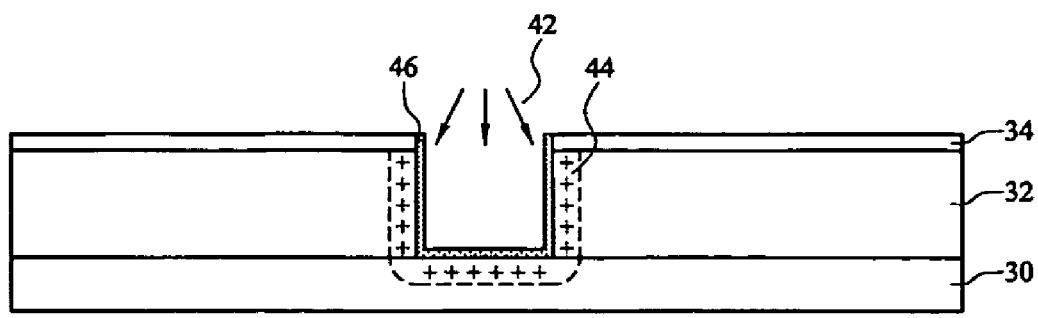

Next, in FIG. 2C, using the oxide layer 34 as a mask, the exposed area of the N-type epitaxial layer 32 under the opening 38 is etched until the surface of the P-type semiconductor silicon substrate 30 is exposed, thus a deep trench 40 is formed. Next, in FIG. 2D, using an ion implantation 42 with P+-type dopants, such as a tilt-angle ion implantation with B+ ions, a P+-type diffusion region 44 is formed in the sidewall and bottom of the deep trench 40. Then, an oxide liner 46 is formed on the sidewall and bottom of the deep trench 40 to repair the damaged surface caused by the ion implantation 42.

Figure 2E:
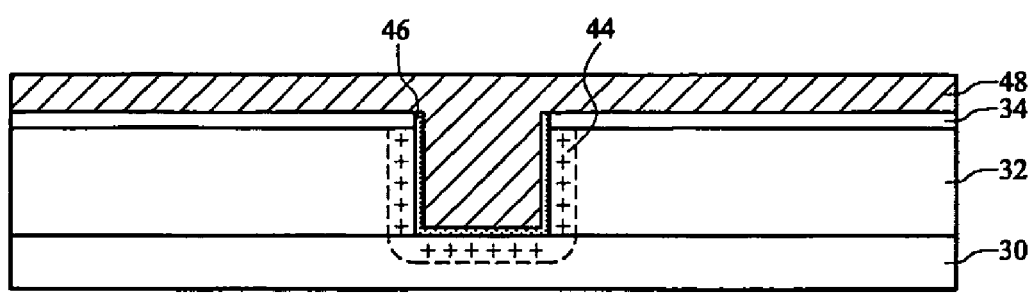
Figure 2F:
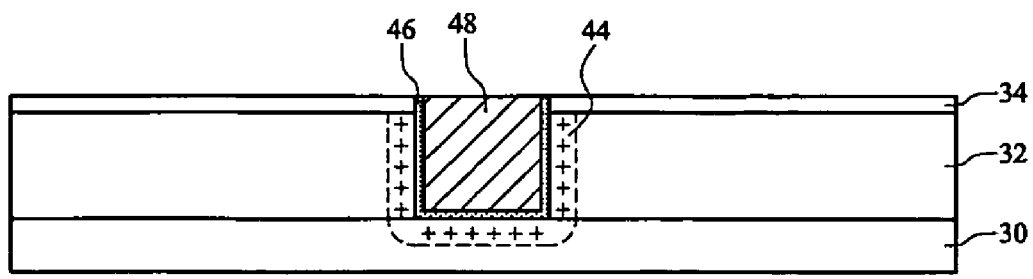
Figure 2G:
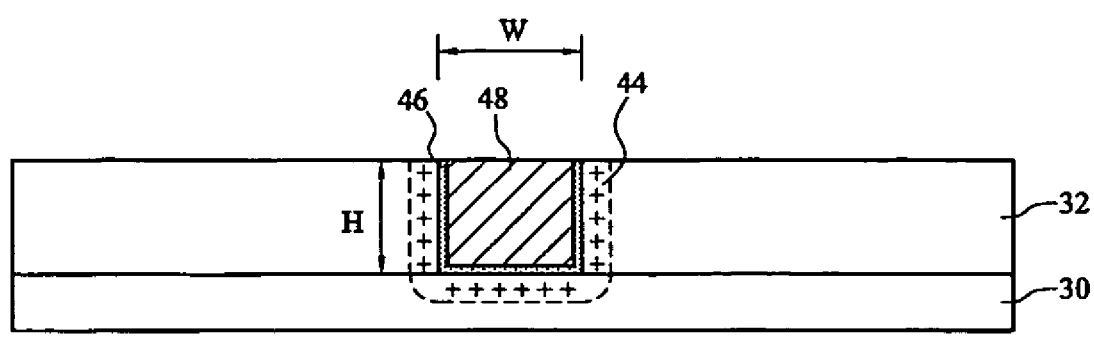

Thereafter, in FIG. 2E, an undoped polysilicon layer 48 is deposited on the entire surface of the P-type semiconductor silicon substrate 30 to fill the deep trench 40. Then, the thermal annealing is used to reduce the grain size of the undoped polysilicon layer 48 to prevent the deep trench 40 being partially filled with the undoped polysilicon layer 48 from voids formed in the undoped polysilicon layer 48. Next, in FIG. 2F, using an etching back process, the undoped polysilicon layer 48 outside the deep trench 40 is removed until the surface of the oxide layer 34 is exposed. Finally, in FIG. 2G, using chemical mechanical polishing (CMP), the oxide layer 34 and a part of the undoped polysilicon layer 48 are removed until the surface of the N-type epitaxial layer 32 is exposed. Then, the thermal annealing is used to re-grow grains of the undoped polysilicon layer 48. This completes P+-type deep trench isolation structure.

The present invention provides the P+-type diffusion region 44 and the undoped polysilicon layer 48 within the deep trench 40 as the P+-type deep trench isolation structure. Since the P+-type diffusion region 44 is formed on the sidewall and bottom of the deep trench 40 by the ion implantation 42, it is unnecessary to use the thermal annealing to drive the vertical diffusion mechanism of the P+-type dopants, resulting in decreased thermal budget. Also, compared with the conventional deep trench isolation structure having an H/W ratio equal to 1.2 by using thermal annealing, the present invention can control the H/W ratio of the P+-type deep trench isolation structure at 4-3. This can reduce the surface size of the P+-type deep trench isolation structure.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
   a semiconductor silicon substrate with a first type conductivity;
   an epitaxial layer with a second type conductivity different from the first type conductivity disposed on the semiconductor silicon substrate;
   a high voltage device defined by at least two deep trench isolation structures, wherein each the isolation structure comprises:
   a deep trench passing through the epitaxial layer;
   an ion diffusion region with the first type conductivity formed in the epitaxial layer and surrounding the sidewall and bottom of the deep trench; and
   an undoped polysilicon layer filling the deep trench;
   wherein the high voltage device comprises at least one field oxidation region interposed between a transistor and the deep trench isolation structures.

2. The semiconductor device as claimed in claim 1, wherein the first type conductivity is P-type, and the second type conductivity is N-type.

3. The semiconductor device as claimed in claim 1, wherein the ion diffusion region is a P+-type ion diffusion region.

4. The semiconductor device as claimed in claim 1, wherein the first type conductivity is N-type, and the second type conductivity is P-type.

5. The semiconductor device as claimed in claim 1, wherein the ion diffusion region is a N+-type ion diffusion region.

6. The semiconductor device as claimed in claim 1, further comprising an oxide liner formed on the sidewall and bottom of the deep trench.

7. The semiconductor device as claimed in claim 1, wherein the high voltage device comprises:
   a buried layer with the second type conductivity, which is formed between the epitaxial layer and the semiconductor silicon substrate; and
   a body with the first type conductivity, which is formed in the epitaxial layer between two field oxidation regions.

8. The semiconductor device as claimed in claim 7, wherein the transistor comprises:
   a gate structure formed overlying the body;
   a pair of first diffusion regions with the second type conductivity formed in the body and laterally adjacent to the gate structure; and
   a pair of second diffusion regions with the first type conductivity formed in the body and laterally adjacent to the first diffusion regions, respectively.

9. A semiconductor device, comprising:
   a semiconductor silicon substrate with a first type conductivity;
   an epitaxial layer with a second type conductivity different from the first type conductivity disposed on the semiconductor silicon substrate;
   a high voltage device defined by at least two deep trench isolation structures, wherein each the isolation structure comprises:
   a deep trench passing through the epitaxial layer;

an ion diffusion region with the first type conductivity formed in the epitaxial layer and surrounding the sidewall and bottom of the deep trench; and an undoped polysilicon layer filling the deep trench;

wherein the high voltage device comprises at least a sinker with the second type conductivity and a transistor, the sinker is coupled to the semiconductor silicon substrate and separated from the deep trench isolation structures by a first field oxidation region, and separated from the transistor by a second field oxidation region.

10. The semiconductor device as claimed in claim 9, wherein the first type conductivity is P-type, and the second type conductivity is N-type.

11. The semiconductor device as claimed in claim 9, wherein the ion diffusion region is a $P^+$-type ion diffusion region.

12. The semiconductor device as claimed in claim 9, wherein the first type conductivity is N-type, and the second type conductivity is P-type.

13. The semiconductor device as claimed in claim 9, wherein the ion diffusion region is a N+-type ion diffusion region.

14. The semiconductor device as claimed in claim 9, further comprising an oxide liner formed on the sidewall and bottom of the deep trench.

15. The semiconductor device as claimed in claim 9, wherein the high voltage device further comprises a buried layer with the second type conductivity, which is formed between the epitaxial layer and the semiconductor silicon substrate, wherein the sinker connects the buried layer.

* * * * *